(12) United States Patent
Liu

(10) Patent No.: US 11,588,040 B2
(45) Date of Patent: Feb. 21, 2023

(54) LDMOS DEVICE AND METHOD FOR FORMING THE SAME

(71) Applicant: Shanghai Huahong Grace Semiconductor Manufacturing Corporation, Shanghai (CN)

(72) Inventor: Xianzhou Liu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 257 days.

(21) Appl. No.: 16/789,094

(22) Filed: Feb. 12, 2020

(65) Prior Publication Data

US 2021/0028299 A1    Jan. 28, 2021

(30) Foreign Application Priority Data

Jul. 24, 2019  (CN) .......................... 201910670814.9

(51) Int. Cl.
*H01L 29/66*  (2006.01)
*H01L 21/8234*  (2006.01)
(Continued)

(52) U.S. Cl.
CPC ............... *H01L 29/66681* (2013.01); *H01L 21/823443* (2013.01); *H01L 29/16* (2013.01); *H01L 29/7816* (2013.01)

(58) Field of Classification Search
None
See application file for complete search history.

(56) References Cited

U.S. PATENT DOCUMENTS

| 4,290,077 A | * | 9/1981 | Ronen | ................... H01L 29/404 |
| | | | | 257/E29.054 |
| 2005/0020021 A1 | * | 1/2005 | Fujiwara | ......... H01L 21/823828 |
| | | | | 257/E21.507 |

(Continued)

FOREIGN PATENT DOCUMENTS

CN         1431710 A        7/2003

OTHER PUBLICATIONS

Office Action issued in corresponding Chinese Application No. 201910670814.9 dated Sep. 15, 2022.

*Primary Examiner* — Bilkis Jahan

(74) *Attorney, Agent, or Firm* — Harness, Dickey & Pierce, P.L.C.

(57) ABSTRACT

An LDMOS device and a method for forming the LDMOS device are provided. The LDMOS device includes: a substrate formed with a source region, a drain region and a drift region; a gate structure; a silicide block layer; a first conductive structure having one end electrically connected with the source region, a second conductive structure having one end electrically connected with the drain region; a first metal interconnecting structure electrically connected with the other end of the first conductive structure, a second metal interconnecting structure electrically connected with the other end of the second conductive structure; a third conductive structure having one end disposed on a surface of the silicide block layer; and a third metal interconnecting structure electrically connected with the other end of the third conductive structure. The LDMOS device has increased breakdown voltage, and reduced on-resistance, and its preparation process is safer and easier to control.

11 Claims, 5 Drawing Sheets

(51) Int. Cl.
    *H01L 29/16*          (2006.01)
    *H01L 29/78*          (2006.01)

(56) References Cited

U.S. PATENT DOCUMENTS

| | | | |
|---|---|---|---|
| 2008/0157218 A1* | 7/2008 | Ahn | H01L 27/092 |
| | | | 327/437 |
| 2009/0142918 A1* | 6/2009 | Liu | H01L 27/105 |
| | | | 438/627 |
| 2013/0134512 A1* | 5/2013 | Cheng | H01L 29/402 |
| | | | 257/E29.256 |
| 2013/0277741 A1 | 10/2013 | Guowei et al. | |
| 2019/0088777 A1* | 3/2019 | Lu | H01L 29/407 |
| 2019/0288066 A1* | 9/2019 | Lee | H01L 21/26586 |
| 2020/0144414 A1* | 5/2020 | Zhang | H01L 29/0649 |

\* cited by examiner providing a substrate, wherein a source region, a drain region and a drift region are formed in the substrate, the drain region is disposed in the drift region, a gate structure is disposed on a surface of the substrate, the source region and the drain region are disposed in the substrate respectively at two sides of the gate structure, and a gap is formed between the drain region and the gate structure — S11 forming a silicide block layer covering at least a portion of the surface of the substrate between the gate structure and the drain region — S13 forming a first conductive structure and a second conductive structure, wherein one end of the first conductive structure is electrically connected with the source region, and one end of the second conductive structure is electrically connected with the drain region — S15 forming a first metal interconnecting structure and a second metal interconnecting structure, wherein the first metal interconnecting structure is electrically connected with the other end of the first conductive structure, and the second metal interconnecting structure is electrically connected with the other end of the second conductive structure — S17 forming a third conductive structure, wherein one end of the third conductive structure is disposed on a surface of the silicide block layer — S19 forming a third metal interconnecting structure electrically connected with the other end of the third conductive structure — S21

FIG. 1

LDMOS DEVICE AND METHOD FOR FORMING THE SAME

CROSS-REFERENCE TO RELATED APPLICATIONS

This application claims the benefit of priority to Chinese patent application No. 201910670814.9, filed on Jul. 24, 2019. The entire contents of this application are hereby incorporated herein by reference.

TECHNICAL FIELD

The present disclosure relates to the field of semiconductor manufacturing technologies, and more particularly to an LDMOS device and a method for forming the same.

BACKGROUND

Lateral Diffused Metal Oxide Semiconductor (LDMOS) devices have been used in many fields, such as mobile phones, LED displays, LCD display drivers, or high power amplifiers in wireless base stations, due to their performance advantages in linearity, power gain and breakdown voltage.

In order to improve the breakdown voltage, conventional LDMOS devices are disposed with a field plate to deplete a drift area. However, existing scheme for improving breakdown voltage may bring an increase in an on-resistance of the LDMOS device. Therefore, there is a need for a method for improving the breakdown voltage without lowering the on-resistance of the LDMOS device.

SUMMARY

In order to improve the breakdown voltage of the LDMOS device without adversely affecting the on-resistance of the LDMOS device, an embodiment of the present disclosure provides a method for forming an LDMOS device. The method includes: providing a substrate, wherein a source region, a drain region and a drift region are formed in the substrate, the drain region is disposed in the drift region, a gate structure is disposed on a surface of the substrate, the source region and the drain region are disposed in the substrate respectively at two sides of the gate structure, and a gap is formed between the drain region and the gate structure; forming a silicide block layer covering at least a portion of the surface of the substrate between the gate structure and the drain region; forming a first conductive structure and a second conductive structure, wherein one end of the first conductive structure is electrically connected with the source region, and one end of the second conductive structure is electrically connected with the drain region; forming a first metal interconnecting structure and a second metal interconnecting structure, wherein the first metal interconnecting structure is electrically connected with the other end of the first conductive structure, and the second metal interconnecting structure is electrically connected with the other end of the second conductive structure; forming a third conductive structure, wherein one end of the third conductive structure is disposed on a surface of the silicide block layer; and forming a third metal interconnecting structure electrically connected with the other end of the third conductive structure.

According to some embodiment, the method further includes: forming a stop layer covering an exposed surface of the substrate, the source region, the drain region, the gate structure, and the silicide block layer, before forming the first conductive structure and the second conductive structure; wherein the one end of the first conductive structure and the one end of the second conductive structure respectively pass through the stop layer and extend to a surface of the source region and a surface of the drain region, and the one end of the third conductive structure extends to a surface of the stop layer.

According to some embodiment, the stop layer is made of nitride or oxynitride.

According to some embodiment, the method further includes: forming a fourth conductive structure and a fifth conductive structure when forming the third conductive structure, wherein one end of the fourth conductive structure is electrically connected with the first metal interconnecting structure, and one end of the fifth conductive structure is electrically connected with the second metal interconnecting structure.

According to some embodiment, the method further includes: forming a fourth metal interconnecting structure and a fifth metal interconnecting structure when forming the third metal interconnecting structure, wherein the fourth metal interconnecting structure is electrically connected with the other end of the fourth conductive structure, and the fifth metal interconnecting structure is electrically connected with the other end of the fifth conductive structure.

According to some embodiment, the fourth metal interconnecting structure is electrically connected with the third metal interconnecting structure; and the fourth metal interconnecting structure is configured to be applied with a first voltage, the fifth metal interconnecting structure is configured to be applied with a second voltage, and the second voltage is higher than the first voltage.

According to some embodiment, the silicide block layer covers a portion of a top surface of the gate structure, a sidewall of the gate structure, and a portion of the surface of the substrate between the sidewall of the gate structure and the drain region.

According to some embodiment, a plurality of third conductive structures are formed with a spacing from each other; and the plurality of third conductive structures are respectively disposed on the surface of the silicide block layer on the top surface of the gate structure, the surface of the silicide block layer on the sidewall of the gate structure, and the surface of the silicide block layer on the substrate between the sidewall of the gate structure and the drain region; or, the plurality of third conductive structures are respectively disposed on the surface of the silicide block layer on the sidewall of the gate structure and the surface of the silicide block layer on the substrate between the sidewall of the gate structure and the drain region; or, the plurality of third conductive structures are respectively disposed on the surface of the silicide block layer on the substrate between the sidewall of the gate structure and the drain region.

According to some embodiment, the silicide block layer is made of oxide or nitride.

According to some embodiment, the method further includes: forming a metal silicide layer on the source region, the drain region and at least a portion of the top surface of the gate structure after forming the silicide block layer, and before forming the first conductive structure and the second conductive structure.

According to some embodiment, forming the first conductive structure and the second conductive structure includes: forming a first interlayer dielectric layer covering an exposed surface of the substrate, the source region, the drain region, the gate structure, and the silicide block layer; forming a first patterning mask layer on a surface of the first interlayer dielectric layer, wherein the first patterning mask layer predefines patterns and positions of the first conductive structure and the second conductive structure, and the positions of the first conductive structure and the second conductive structure respectively align with the source region and the drain region; etching the first interlayer dielectric layer with the first patterning mask layer as a mask to form a first opening and a second opening passing through the first interlayer dielectric layer; removing the first patterning mask layer; and filling the first opening and the second opening with a conductive material to form the first conductive structure and the second conductive structure.

According to some embodiment, forming the first metal interconnecting structure and the second metal interconnecting structure includes: forming a second interlayer dielectric layer covering the surface of the first interlayer dielectric layer, the first conductive structure and the second conductive structure; forming a second patterning mask layer on a surface of the second interlayer dielectric layer, wherein the second patterning mask layer predefines patterns and positions of the first metal interconnecting structure and the second metal interconnecting structure, and the positions of the first metal interconnecting structure and the second metal interconnecting structure respectively align with the first conductive structure and the second conductive structure; etching the second interlayer dielectric layer with the second patterning mask layer as a mask to form a first opening and a second opening passing through the second interlayer dielectric layer; removing the second patterning mask layer; and filling the first opening and the second opening passing through the second interlayer dielectric layer with a conductive material to form the first metal interconnecting structure and the second metal interconnecting structure.

According to some embodiment, forming the third conductive structure includes: forming a third interlayer dielectric layer covering the surface of the second interlayer dielectric layer, the first metal interconnecting structure and the second metal interconnecting structure; forming a third patterning mask layer on a surface of the third interlayer dielectric layer, wherein the third patterning mask layer predefines a pattern and a position of the third conductive structure, and the position of the third conductive aligns with the silicide block layer; etching the third interlayer dielectric layer, the second interlayer dielectric layer and the first interlayer dielectric layer with the third patterning mask layer as a mask to form a third opening passing through the third interlayer dielectric layer, the second interlayer dielectric layer and the first interlayer dielectric layer; removing the third patterning mask layer; and filling the third opening with a conductive material to form the third conductive structure.

According to some embodiment, forming the third metal interconnecting structure includes: forming a fourth interlayer dielectric layer covering the surface of the third interlayer dielectric layer and the third conductive structure; forming a fourth patterning mask layer on a surface of the fourth interlayer dielectric layer, wherein the fourth patterning mask layer predefines a pattern and a position of the third metal interconnecting structure, and the position of the third metal interconnecting structure aligns with the third conductive structure; etching the fourth interlayer dielectric layer with the fourth patterning mask layer as a mask to form a third opening passing through the fourth interlayer dielectric layer; removing the fourth patterning mask layer; and filling the third opening passing through the fourth interlayer dielectric layer with a conductive material to form the third metal interconnecting structure.

Accordingly, embodiments of the present disclosure further provide an LDMOS device, including: a substrate, wherein a source region, a drain region and a drift region are formed in the substrate, and the drain region is disposed in the drift region; a gate structure disposed on a surface of the substrate between the source region and the drain region, wherein a gap is formed between the gate structure and the drain region; a silicide block layer covering at least a portion of the surface of the substrate between the gate structure and the drain region; a first conductive structure and a second conductive structure, wherein one end of the first conductive structure is electrically connected with the source region, and one end of the second conductive structure is electrically connected with the drain region; a first metal interconnecting structure and a second metal interconnecting structure, wherein the first metal interconnecting structure is electrically connected with the other end of the first conductive structure, and the second metal interconnecting structure is electrically connected with the other end of the second conductive structure; a third conductive structure with one end disposed on a surface of the silicide block layer; and a third metal interconnecting structure electrically connected with the other end of the third conductive structure.

According to some embodiment, the LDMOS device further includes a stop layer covering the surface of the substrate, the source region, the drain region, the gate structure, and the silicide block layer; wherein the one end of the first conductive structure and the one end of the second conductive structure respectively pass through the stop layer and extend to a surface of the source region and a surface of the drain region, and the one end of the third conductive structure extends to a surface of the stop layer.

According to some embodiment, the stop layer is made of nitride or oxynitride.

According to some embodiment, the LDMOS device further includes a fourth conductive structure and a fifth conductive structure, wherein one end of the fourth conductive structure is electrically connected with the first metal interconnecting structure, and one end of the fifth conductive structure is electrically connected with the second metal interconnecting structure.

According to some embodiment, the LDMOS device further includes a fourth metal interconnecting structure and a fifth metal interconnecting structure, wherein the fourth metal interconnecting structure is electrically connected with the other end of the fourth conductive structure, and the fifth metal interconnecting structure is electrically connected with the other end of the fifth conductive structure.

According to some embodiment, the fourth metal interconnecting structure is electrically connected with the third metal interconnecting structure; and the fourth metal interconnecting structure is configured to be applied with a first voltage, the fifth metal interconnecting structure is configured to be applied with a second voltage, and the second voltage is higher than the first voltage.

According to some embodiment, the silicide block layer covers a portion of a top surface of the gate structure, a sidewall of the gate structure, and a portion of the surface of the substrate between the sidewall of the gate structure and the drain region.

According to some embodiment, a plurality of third conductive structures are disposed with a spacing from each other; and the plurality of third conductive structures are respectively disposed on the surface of the silicide block layer on the top surface of the gate structure, the surface of the silicide block layer on the sidewall of the gate structure, and the surface of the silicide block layer on the substrate between the sidewall of the gate structure and the drain region; or, the plurality of third conductive structures are respectively disposed on the surface of the silicide block layer on the sidewall of the gate structure and the surface of the silicide block layer on the substrate between the sidewall of the gate structure and the drain region; or, the plurality of third conductive structures are respectively disposed on the surface of the silicide block layer on the substrate between the sidewall of the gate structure and the drain region.

According to some embodiment, the silicide block layer is made of oxide or nitride.

According to some embodiment, the LDMOS device further includes a metal silicide layer disposed on the source region, the drain region, and at least a portion of a top surface of the gate structure.

According to some embodiment, the LDMOS device further includes a first interlayer dielectric layer covering the surface of the substrate, the source region, the drain region, the gate structure, and the silicide block layer; and the first conductive structure and the second conductive structure are disposed in the first interlayer dielectric layer.

According to some embodiment, the LDMOS device further includes a second interlayer dielectric layer covering a surface of the first interlayer dielectric layer, the first conductive structure and the second conductive structure; and the first metal interconnecting structure and the second metal interconnecting structure are disposed in the second interlayer dielectric layer.

According to some embodiment, the LDMOS device further includes a third interlayer dielectric layer covering a surface of the second interlayer dielectric layer, the first metal interconnecting structure and the second metal interconnecting structure; and the third conductive structure is disposed in the third interlayer dielectric layer, the second interlayer dielectric layer and the first interlayer dielectric layer.

According to some embodiment, the LDMOS device further includes a fourth interlayer dielectric layer covering a surface of the third interlayer dielectric layer and the third conductive structure; and the third metal interconnecting structure is disposed in the fourth interlayer dielectric layer.

Compared with the prior art, the embodiments of the present disclosure have the following beneficial effects.

According to some embodiment of the present disclosure, the method for forming the LDMOS device includes forming the third conductive structure and the third metal interconnecting structure on the surface of the silicide block layer, wherein the third metal interconnecting structure is electrically connected with the third conductive structure to form a field plate. The field plate acts as an upper plate of a capacitor, the drift region acts as a lower plate of the capacitor, and the silicide block layer acts as a dielectric. The field plate increases the breakdown voltage that the LDMOS device can withstand by changing an electric field distribution. Further, since the silicide block layer is formed on the surface of the substrate, the on-resistance of the LDMOS device is greatly reduced, as compared with the field plate of an STI formed between the source region and the drain region in the conventional technology.

Further, the first conductive structure and the second conductive structure are used to electrically connect different metal interconnecting structures (i.e., the first metal interconnecting structure and the second metal interconnecting structure) in the same metal interconnecting layer with an active area in the substrate, so that both of them can be formed in the same process step, and can be formed with the same contact opening forming process parameters and material; and after forming the first conductive structure, the second conductive structure, the first metal interconnecting structure and the second metal interconnecting structure, the third conductive structure is formed together with conductive vias (i.e., the fourth conductive structure and the fifth conductive structure) between different metal interconnecting layers, and thus the third conductive structure can be formed with the same process parameter and material with the conductive vias. Compared to the conventional method in which the first conductive structure, the second conductive structure and the third conductive structure are formed in the same process step, the method according to some embodiment of the present disclosure can flexibly control the formation of the third conductive structure.

Further, before forming the first conductive structure and the second conductive structure, the method further includes forming the stop layer covering the exposed surface of the substrate, the source region, the drain region, the gate structure and the silicide block layer, wherein one end of the first conductive structure and one end of the second conductive structure respectively pass through the stop layer and extend to the surface of the source region and the surface of the drain region, and one end of the third conductive structure extends to the surface of the stop layer. That is, the etching process used in the process for forming the first conductive structure and the second conductive structure can etch the stop layer, while the etching process used in forming the third conductive structure cannot etch the stop layer, thus even when the third conductive structure is very close to a side edge of the gate structure, the third conductive structure would not contact with the substrate although the stop layer located at the side edge of the gate structure is very thin, which in turn would not cause a breakdown voltage to drop in the LDMOS device. Therefore, the third conductive structure according to some embodiment of the present disclosure is safer and more reliable.

Further, the silicide block layer covers a portion of the top surface of the gate structure, the sidewall of the gate structure, and the surface of the substrate between the sidewall of the gate structure and the drain region. Since one edge of the gate structure adjacent to the drain region is a hot spot prone to breakdown, a capacitive structure made by the field plate, the silicide block layer and the drift region transfers the hot spot prone to breakdown when the silicide block layer covers the edge of the gate structure adjacent to the drain region, which further increases the breakdown voltage of the LDMOS device.

Further, the method includes forming the fourth metal interconnecting structure and the fifth metal interconnecting structure, wherein the fourth metal interconnecting structure is electrically connected with the other end of the fourth conductive structure so as to be connected with the source region, and the fifth metal interconnecting structure is electrically connected with the other end of the fifth conductive structure so as to be connected with the drain region. The fourth metal interconnecting structure is electrically connected with the third metal interconnecting structure, the fourth metal interconnecting structure is configured to be applied with the first voltage, the fifth metal interconnecting structure is configured to be applied with the second voltage, and the second voltage is higher than the first voltage. Therefore, the third conductive structure can introduce a low voltage near the drain region, which effectively transfers a high electric field originally pointing to the drain region from the side edge of the gate structure, thereby increasing the breakdown voltage of the LDMOS device.

According to some embodiment of the present disclosure, the LDMOS device includes the third conductive structure disposed on the surface of the silicide block layer, wherein the third conductive structure is electrically connected with the third metal interconnecting structure to form the field plate. The field plate acts as an upper plate of the capacitor, the drift region acts as a lower plate of the capacitor, and the silicide block layer acts as a dielectric. The field plate increases the breakdown voltage that the LDMOS device can withstand by changing an electric field distribution. Further, since the silicide block layer is formed on the surface of the substrate, the on-resistance of the LDMOS device is greatly reduced, as compared with the field plate of the STI formed between the source region and the drain region to in the conventional technology.

Further, the first conductive structure and the second conductive structure are disposed in the first interlayer dielectric layer for electrically connecting different metal interconnecting structures (i.e., the first metal interconnecting structure and the second metal interconnecting) in the same metal interconnecting layer with the active area in the substrate, so that both of them can be formed with the same contact opening forming process parameter and material; and the third conductive structure is disposed in the third interlayer dielectric layer, the second interlayer dielectric layer and the first interlayer dielectric layer, and can be formed with the same process parameter and material with conductive vias (i.e., the fourth conductive structure and the fifth conductive structure) between different metal interconnecting layers. Compared with the conventional device in which the first conductive structure, the second conductive structure and the third conductive structure are disposed in the same interlayer dielectric layer, or the first conductive structure, the second conductive structure and the third conductive structure are used for electrically connecting different metal interconnecting structures in the same metal interconnecting layer with the active area in the substrate, the LDMOS device according to some embodiment of the present disclosure can flexibly control the structure and formation of the third conductive structure.

Further, the LDMOS device includes the stop layer covering the exposed surface of the substrate, the source region, the drain region, the gate structure and the silicide block layer, wherein one end of the first conductive structure and one end of the second conductive structure pass through the stop layer and extend to the surface of the source region and the surface of the drain region, and one end of the third conductive structure extends to the surface of the stop layer, thus even when the third conductive structure is very close to the side edge of the gate structure, the third conductive structure would not contact with the substrate although the stop layer located at the side edge of the gate structure is very thin, which in turn would not cause a breakdown voltage drop in the LDMOS device.

Further, the silicide block layer covers a portion of the top surface of the gate structure, the sidewall of the gate structure, and a portion of the surface of the substrate between the sidewall of the gate structure and the drain region. Since one edge of the gate structure adjacent to the drain region is a hot spot prone to breakdown, a capacitive structure made by the field plate, the silicide block layer and the drift region transfers the hot spot prone to breakdown when the silicide block layer covers the edge of the gate structure adjacent to the drain region, which further increases the breakdown voltage of the LDMOS device.

Further, the LDMOS device includes the fourth metal interconnecting structure and the fifth metal interconnecting structure, wherein the fourth metal interconnecting structure is electrically connected with the other end of the fourth conductive structure so as to be connected with the source region, and the fifth metal interconnecting structure is electrically connected with the other end of the fifth conductive structure so as to be connected with the drain region. The fourth metal interconnecting structure is electrically connected with the third metal interconnecting structure, the fourth metal interconnecting structure is configured to be applied with the first voltage, the fifth metal interconnecting structure is configured to be applied with the second voltage, and the second voltage is higher than the first voltage. Therefore, the third conductive structure can introduce a low voltage near the drain region, which effectively transfers a high electric field originally pointing to the drain region from the side edge of the gate structure, thereby increasing the breakdown voltage of the LDMOS device.

BRIEF DESCRIPTION OF THE DRAWINGS

FIG. 1 schematically illustrates a flow chart showing a method for forming an LDMOS device according to an embodiment of the present disclosure.

DETAILED DESCRIPTION

The present disclosure provides an LDMOS device and a method for forming the LDMOS device, which will be described in detail below with reference to the accompanying drawings.

Referring to FIG. 1, with reference to FIGS. 2 to 8, FIG. 1 schematically illustrates a flow chart showing a method for forming an LDMOS device according to an embodiment of the present disclosure; and FIGS. 2 to 8 are cross-sectional schematic views of an LDMOS device formed by steps of the method for forming the LDMOS device according to an embodiment of the present disclosure. In some embodiment, the method for forming the LDMOS device includes the following steps.

Figure 2:
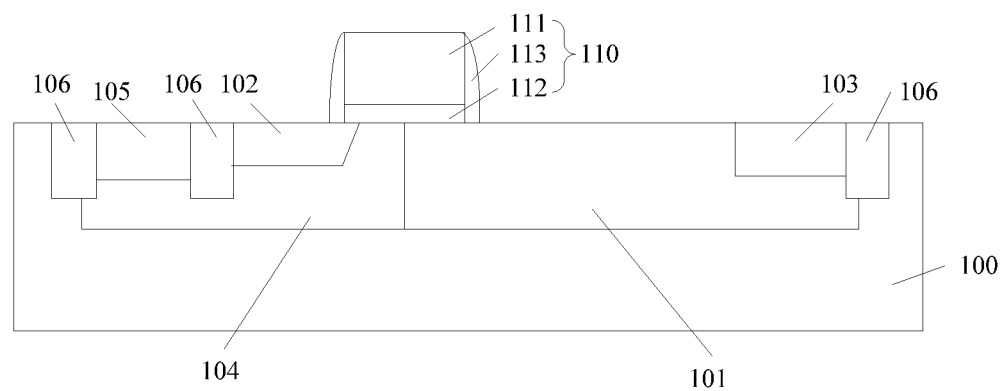
FIGS. 2 to 8 schematically illustrate cross-sectional views of intermediate structure of an LDMOS device according to an embodiment of the present disclosure.

Performing S11, referring to FIG. 2, providing a substrate 100. A drift region 101, a source region 102 and a drain region 103 are formed in the substrate 100, and the drain region 103 is disposed in the drift region 101. A gate structure 110 is disposed on a surface of the substrate 100. The source region 102 and the drain region 103 are respectively disposed in the substrate 100 at both sides of the gate structure 110, and a gap is formed between the drain region 103 and the gate structure 110.

In some embodiment, the substrate 100 may be a silicon substrate, a germanium substrate, a silicon carbide substrate, or a germanium silicon substrate.

In some embodiment, the LDMOS device is an N-type LDMOS device and the drift region 101 is N-type. In other embodiments, the LDMOS device is a P-type LDMOS device and the drift region 101 is P-type.

In some embodiment, a body region 104 is also formed in the substrate 100, and the body region 104 has an opposite conductivity type to the drift region 101. The source region 102 is formed in the body region 104, and the source region 102, the drain region 103, and the drift region 101 have the same conductivity type, for example, all are N-type. The respective surfaces of the drift region 101, the body region 104, the source region 102, and the drain region 103 may be flush with the surface of the substrate 100.

In some embodiment, a well region contact end 105 is further formed in the substrate 100. The well region contact end 105 is located in the body region 104, and the well region contact end 105 and the source region 102 have opposite conductivity type. Other types of well regions may also be disposed in the substrate 100, and are not described herein.

In some embodiment, a shallow trench isolation (STI) 106 is also formed in the substrate 100 for defining an active area.

In some embodiment, the gate structure 110 may include a gate layer 111 and a gate dielectric layer 112.

In some embodiment, the gate structure 110 may further include a sidewall 113. The gap is formed between the drain region 103 and the sidewall 113 of the gate structure 110 adjacent to the drain region.

Figure 3:
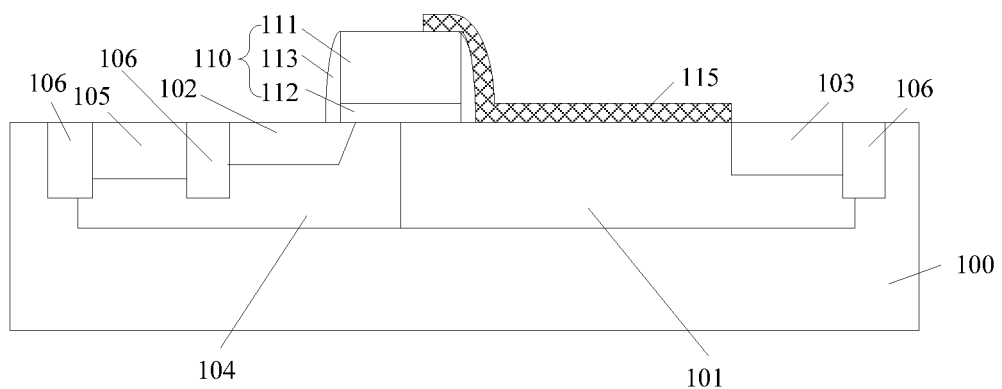

Performing S13, referring to FIG. 3, forming a silicide block layer 115 for covering at least a portion of the surface of the substrate 100 between the gate structure 110 and the drain region 103.

In some embodiment, the silicide block layer 115 covers a portion of a top surface of the gate structure 110, a sidewall of the gate structure 110, and the surface of the substrate 100 between the sidewall of the gate structure 110 and the drain regions 103. The sidewall of the gate structure 110 is a sidewall of the gate structure 110 adjacent to the drain region 103. When the gate structure 110 includes the gate layer 111, the gate dielectric layer 112, and the sidewall 113, the silicide block layer 115 covers a top surface of the gate layer 111 and a surface of the sidewall 113 adjacent to the drain region 103.

In some embodiment, the silicide block layer 115 is a metal silicide block layer. The silicide block layer 115 may be made of a material including an oxide such as silicon dioxide, or including a nitride or an oxynitride, such as silicon nitride and/or silicon oxynitride, or including a stacked structure formed of oxide, nitride, and oxynitride, wherein the oxide may be located in a lower layer, that is, near the surface of the substrate 100, and the nitride and the oxynitride may be located in an upper layer, that is, away from the surface of the substrate 100.

In some embodiment, the method for forming the silicide block layer 115 includes forming a silicide block material layer (not shown) by deposition. The silicide block material layer covers the surface of the substrate 100, the source region 102, the drain region 103, the drift region 101, the well region contact end 105, the gate structure 110, and the surface of the shallow trench isolation 106. The process of deposition may be chemical vapor deposition, physical vapor deposition or atomic layer deposition. The method further includes: forming a patterning mask layer on the surface of the silicide block material layer predefining a region where the silicide block layer 115 to be formed is located, etching the silicide block material layer with the patterning mask layer as a mask to form the silicide block layer 115, and removing the patterning mask layer.

Figure 4:
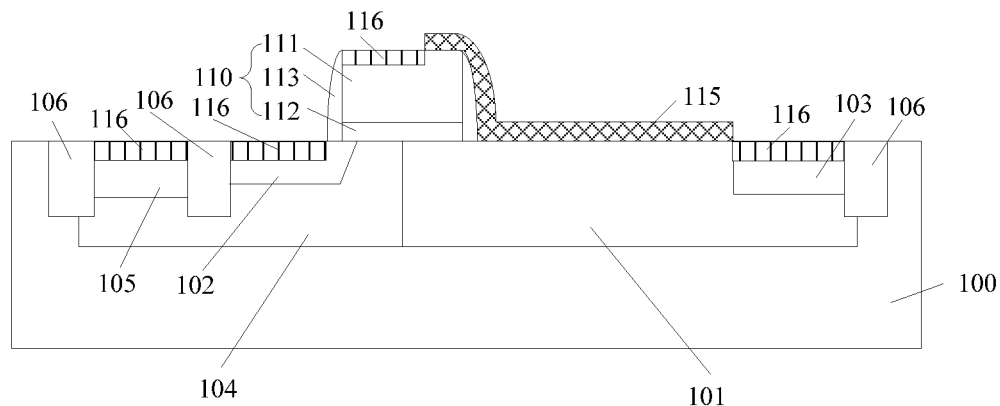

Referring to FIG. 4, in some embodiment, after forming the silicide block layer 115, the method may further include forming a metal silicide layer 116 on the source region 102, the drain region 103 and at least a portion of the top surface of the gate structure 110 to reduce a contact resistance. The metal silicide layer 116 may be made of a material including one or more of CoSix, NiSix, and PtSix. When the well region contact end 105 is formed in the substrate 100, the method further includes forming the metal silicide layer 116 on a surface of the well region contact end 105.

Figure 5:
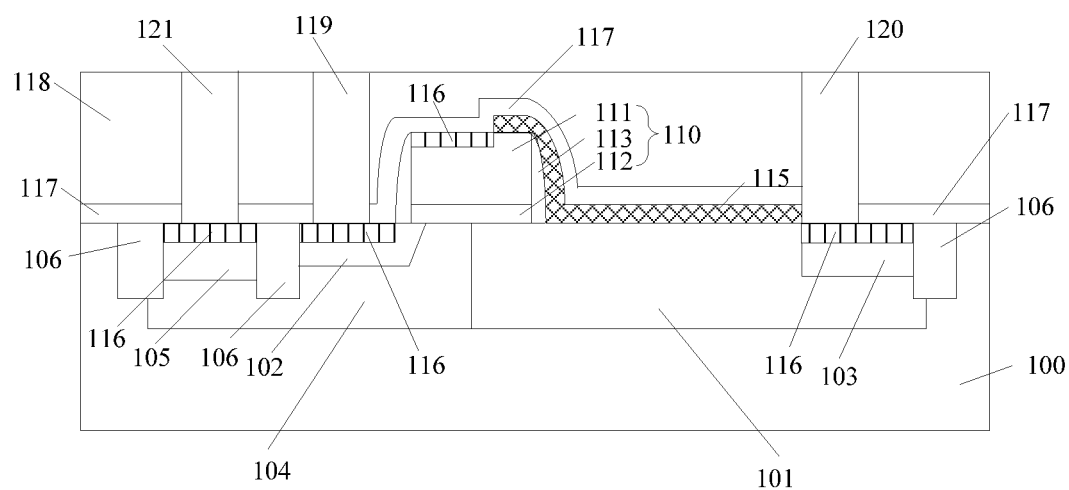

Performing S15, referring to FIG. 5, forming a first conductive structure 119 and a second conductive structure 120. One end of the first conductive structure 119 is electrically connected with the source region 102, and one end of the second conductive structure 120 is electrically connected with the drain region 103.

In some embodiment, before forming the first conductive structure 119 and the second conductive structure 120, the method further includes forming a stop layer 117 covering the exposed surface of the substrate 100, the source region 102, the drain region 103, the gate structure 110 and the silicide block layer 116, and one end of the first conductive structure 119 and one end of the second conductive structure 120 respectively pass through the stop layer 117 and extend to the surface of the source region 102 and the surface of the drain region 103. Herein, the stop layer 117 can function as an etch stop layer.

In some embodiment, the stop layer 117 may be made of nitride or oxynitride, such as silicon nitride or silicon oxynitride.

In some embodiment, while forming the first conductive structure 119 and the second conductive structure 120, the method further includes forming a sixth conductive structure 121, and one end of the sixth conductive structure 121 is electrically connected with the well region contact end 105. When the method includes forming the stop layer 117, the one end of the sixth conductive structure 121 extends through the stop layer 117.

In some embodiment, forming the first conductive structure 119, the second conductive structure 120 and the sixth conductive structure 121 may include: forming a first interlayer dielectric layer 118, wherein the first interlayer dielectric layer 118 covers the exposed surface of the substrate 100, the source region 102, the drain region 103, the gate structure 110 and the silicide block layer 115, and the first interlayer dielectric layer 118 covers the surface of the stop layer 117 when the method includes forming the stop layer 117; forming a first patterning mask layer (not shown) on a surface of the first interlayer dielectric layer 118, wherein the first patterning mask layer predefines patterns and positions of the first conductive structure 119, the second conductive structure 120 and the sixth conductive structure 121, and the positions of the first conductive structure 119, the second conductive structure 120 and the sixth conductive structure 121 respectively align with the source region 102, the drain region 103 and the well region contact end 105; etching the first interlayer dielectric layer 118 and the stop layer 117 with the first patterning mask layer as a mask to expose the surfaces of the source region 102, the drain region 103 and the well region contact end 105, respectively forming a first opening (not shown), a second opening (not shown) and a third opening (not shown) extending through the first interlayer dielectric layer 118; removing the first patterning mask layer; filling the first opening, the second opening and the third opening with a conductive material to form the first conductive structure 119, the second conductive structure 120 and the sixth conductive structure 121.

In some embodiment, the first interlayer dielectric layer 118 may be made of oxide such as silicon dioxide.

In some embodiment, each of the first conductive structure 119, the second conductive structure 120 and the sixth conductive structure 121 may be made of a material including, but not limited to, a metal material including one or more of silver, gold, copper, titanium, palladium, platinum, tungsten and aluminum. The first conductive structure 119, the second conductive structure 120 and the sixth conductive structure 121 may be made of the same conductive material or different conductive materials.

Figure 6:
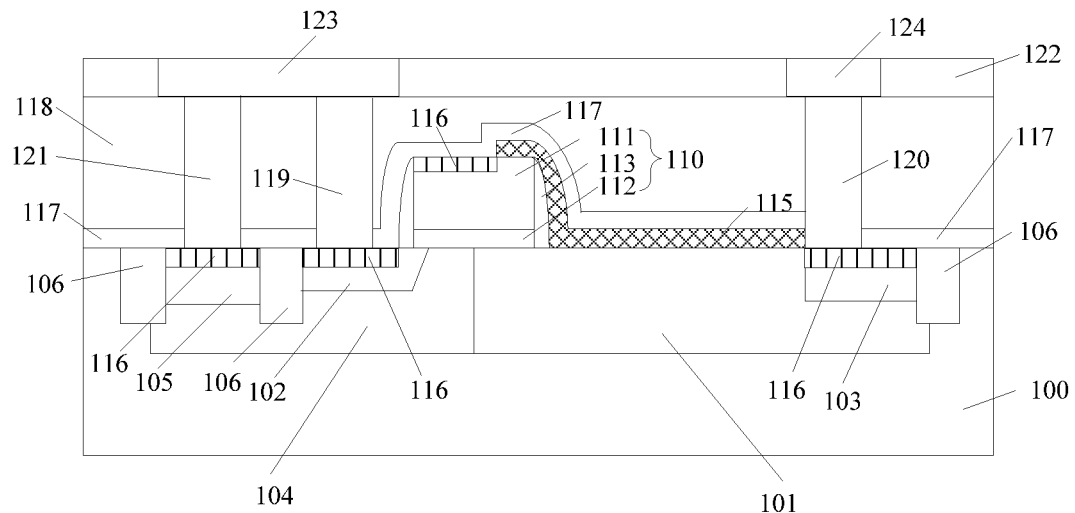

Performing S17, with reference to FIG. 6, forming a first metal interconnecting structure 123 and a second metal interconnecting structure 124. The first metal interconnecting structure 123 is electrically connected with the other end of the first conductive structure 119, and the second metal interconnecting structure 124 is electrically connected with the other end of the second conductive structure 120. The first metal interconnecting structure 123 is also electrically connected with the other end of the sixth conductive structure 121.

In some embodiment, forming the first metal interconnecting structure 123 and the second metal interconnecting structure 124 may include: forming a second interlayer dielectric layer 122, wherein the second interlayer dielectric layer 122 covers the surface of the first interlayer dielectric layer 118, the first conductive structure 119, the second conductive structure 120 and the sixth conductive structure 121; forming a second patterning mask layer on a surface of the second interlayer dielectric layer 122, wherein the second patterning mask layer predefines patterns and positions of the first metal interconnecting structure 123 and the second metal interconnecting structure 124, the positions of the first metal interconnecting structure 123 and the second metal interconnecting structure 124 respectively align with the first conductive structure 119 and the second conductive structure 120, and the position of the first metal interconnecting structure 123 also aligns with the sixth conductive structure 121; etching the second interlayer dielectric layer 122 with the second patterning mask layer as a mask to expose the surfaces of the first conductive structure 119, the second conductive structure 120 and the sixth conductive structure 121, respectively forming a first opening (not shown) and a second opening (not shown) passing through the second interlayer dielectric layer 122; removing the second patterning mask layer; filling the first opening and the second opening with a conductive material to form the first metal interconnecting structure 123 and the second metal interconnecting structure 124.

In some embodiment, the second interlayer dielectric layer 122 may be made of oxide such as silicon dioxide.

In some embodiment, the first metal interconnecting structure 123 and the second metal interconnecting structure 124 may be made of a material including one or more of silver, gold, copper, titanium, palladium, platinum, tungsten and aluminum. In other embodiments, the first metal interconnecting structure 123 and the second metal interconnecting structure 124 may also be made of other conductive materials.

Figure 7:
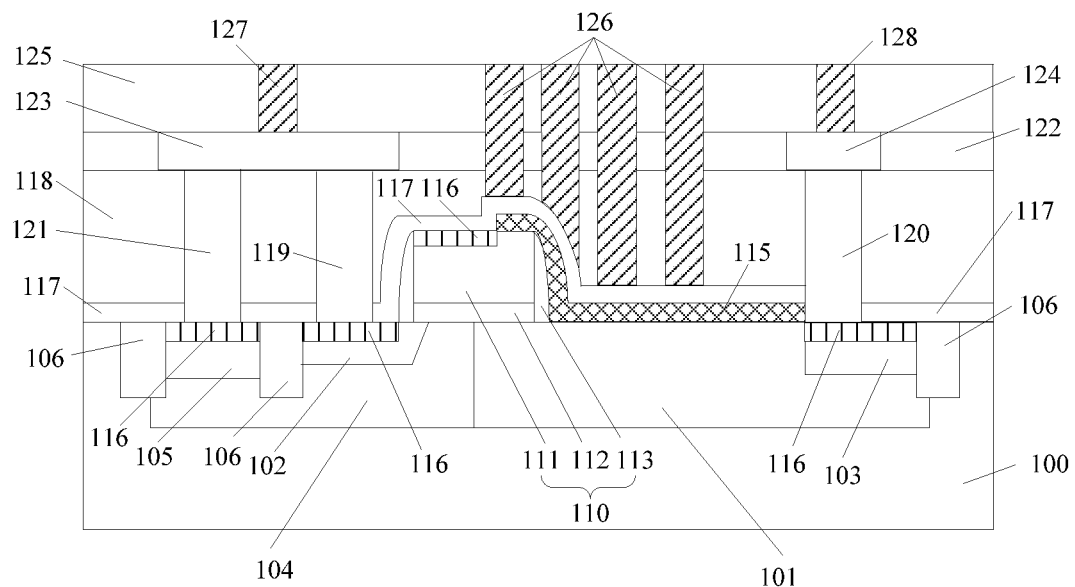

Performing S19, with reference to FIG. 7, forming a third conductive structure 126. One end of the third conductive structure 126 is disposed on a surface of the silicide block layer 115.

In some embodiment, the stop layer 117 is formed on the surface of the silicide block layer 115. One end of the third conductive structure 126 is disposed on the surface of the stop layer 117.

In some embodiment, when forming the third conductive structure 126, the method further includes: forming a fourth conductive structure 127 and a fifth conductive structure 128. One end of the fourth conductive structure 127 is electrically connected with the first metal interconnecting structure 123, and one end of the fifth conductive structure 128 is electrically connected with the second metal interconnecting structure 124.

In some embodiment, forming the third conductive structure 126, the fourth conductive structure 127 and the fifth conductive structure 128 may include: forming a third interlayer dielectric layer 125, wherein the third interlayer dielectric layer 125 covers the surface of the second interlayer dielectric layer 122, the first metal interconnecting structure 123 and the second metal interconnecting structure 124; forming a third patterning mask layer on a surface of the third interlayer dielectric layer 125, wherein the third patterning mask layer predefines respective pattern and position of the third conductive structure 126, the fourth conductive structure 127 and the fifth conductive structure 128, the position of the third conductive structures 126 aligns with the silicide block layer 115, the fourth conductive structure 127 aligns with the first metal interconnecting structure 123, and the fifth conductive structure 128 aligns with the second metal interconnecting structure 124; etching the third interlayer dielectric layer 125 with the third patterning mask layer as a mask to expose surfaces of the first metal interconnecting structure 123 and the second metal interconnecting structure 124, forming a fourth opening in the first metal interconnecting structure 123, a fifth opening in the second metal interconnecting structure 124, and a sixth opening between the fourth opening and the fifth opening; continuing to etch the second interlayer dielectric layer 122 and the first interlayer dielectric layer 118, so that the sixth opening extends through the third interlayer dielectric layer 125, the second interlayer dielectric layer 122 and the first interlayer dielectric layer 118 to expose the surface of the stop layer 117; removing the third patterning mask layer; filling the fourth opening, the fifth opening and the sixth opening with a conductive material to form the fourth conductive structure 127, the fifth conductive structure 128 and the third conductive structure 126.

In some embodiment, the etching process for forming the sixth opening has a higher etching selectivity between the materials of the third interlayer dielectric layer 125, the second interlayer dielectric layer 122 and the first interlayer dielectric layer 118 and the material of the stop layer 117, so that one end of the sixth opening close to the substrate 100 may terminate at the surface of the stop layer 117 without passing through the stop layer 117. Therefore, even when the formed third conductive structure 126 is very close to the edge of the gate structure 110 adjacent to the drain region 103, the third conductive structure 126 would not contact the substrate 100 to cause the breakdown voltage of the LDMOS device to reduce, although the stop layer 117 on the sidewall 113 of the gate structure 110 is very thin (caused by the process of forming the stop layer 117).

In some embodiment, a plurality of third conductive structures 126 are formed, and the plurality of third conductive structures 126 may be disposed to be spaced apart from each other.

In some embodiment, when the silicide block layer 115 covers a portion of the top surface of the gate structure 110, the sidewall of the gate structure 110 and the surface of the substrate 100 between the sidewall of the gate structure 110 and the drain region 103, the plurality of third conductive structures 126 may be respectively disposed on the surface of the silicide block layer 115 on the top surface of the gate structure 110, the surface of the silicide block layer 115 on the sidewall of the gate structure 110, and the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the top surface of the gate structure 110, the surface of the stop layer 117 on the sidewall of the gate structure 110, and the surface of the stop layer 117 on the substrate 100 between the sidewall of the gate structure 110 and the drain region 103.

In some embodiment, the plurality of third conductive structures 126 may be respectively disposed on the surface of the silicide block layer 115 on the sidewall of the gate structure 110 and the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the sidewall of the gate structure 110, and the surface of the stop layer 117 on the substrate 100 between the sidewall of the gate structure 110 and the drain region 103.

In some embodiment, the plurality of third conductive structures 126 may be respectively disposed on the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the substrate 10 between the sidewall of the gate structure 110 and the drain region 103.

Figure 8:
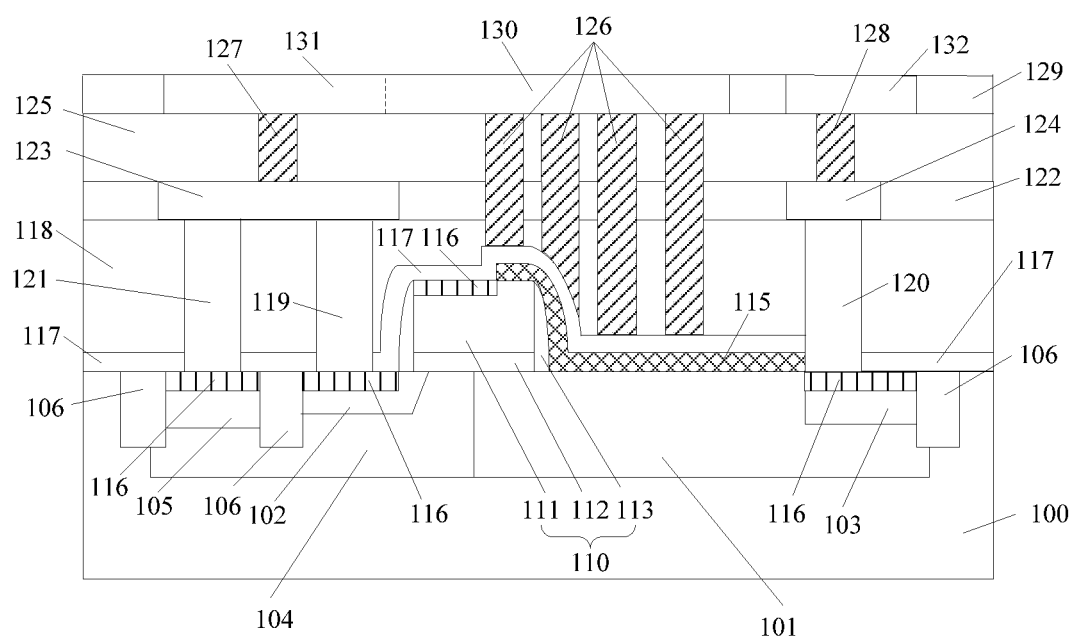

Performing S21, and referring to FIG. 8, forming a third metal interconnecting structure 130. The third metal interconnecting structure 130 is electrically connected with the other end of the third conductive structure 126.

In some embodiment, when forming the third metal interconnecting structure 130, the method further includes: forming a fourth metal interconnecting structure 131 and a fifth metal interconnecting structure 132. The fourth metal interconnecting structure 131 is electrically connected with the other end of the fourth conductive structure 127, and the fifth metal interconnecting structure 132 is electrically connected with the other end of the fifth conductive structure 128.

In some embodiment, the fourth metal interconnecting structure 131 may be electrically connected with the third metal interconnecting structure 130. In other embodiments, an isolation structure may be disposed between the fourth metal interconnecting structure 131 and the third metal interconnecting structure 130, that is, there is no electrical connection relationship between the fourth metal interconnecting structure 131 and the third metal interconnecting structure 130. For the convenience of describing the fourth metal interconnecting structure 131 and the third metal interconnecting structure 130 respectively, the two metal interconnecting structures are separated by a broken line in FIG. 8, but it can be understood that when the four metal interconnecting structure 131 and the third metal interconnecting structure 130 are connected with each other to form one metal interconnecting structure, there is no boundary between the two metal interconnecting structures.

In some embodiment, an isolation structure may be disposed between the third metal interconnecting structure 130 and the fifth metal interconnecting structure 132. That is, there is no electrical connection relationship between the third metal interconnecting structure 130 and the fifth metal interconnecting structure 132.

In some embodiment, the fourth metal interconnecting structure 131 is electrically connected with the third metal interconnecting structure 130. The fourth metal interconnecting structure 131 is configured to be applied with a first voltage, the fifth metal interconnecting structure 132 is configured to be applied with a second voltage that is higher than the first voltage. In this way, the third conductive structure 126 can introduce a low voltage near the drain region 103, which effectively transfers a high electric field originally pointing to the drain region 103 from the side edge of the gate structure 110, thereby increasing the breakdown voltage of the LDMOS device.

In some embodiment, forming the third metal interconnecting structure 130, the fourth metal interconnecting structure 131 and the fifth metal interconnecting structure 132 may include: forming a fourth interlayer dielectric layer 129, wherein the fourth interlayer dielectric layer 129 covers the surface of the third interlayer dielectric layer 125, the third conductive structure 126, the fourth conductive structure 127 and the fifth conductive structure 128; forming a fourth patterning mask layer (not shown) on the surface of the fourth interlayer dielectric layer 129, wherein the fourth patterning mask layer predefines patterns and positions of the third metal interconnecting structure 130, the fourth metal interconnecting structure 131 and the fifth metal interconnecting structure 132, the position of the third metal interconnecting structure 130 aligns with that of the third conductive structure 126, the position of the fourth metal interconnecting structure 131 aligns with that of the fourth conductive structure 127, and the position of the fifth metal interconnecting structure 132 aligns with that of the fifth conductive structure 128; etching the fourth interlayer dielectric layer 129 with the fourth patterning mask layer as a mask to expose surfaces of the third conductive structure 126, the fourth conductive structure 127 and the fifth conductive structure 128, thereby forming a third opening (not shown), a fourth opening (not shown) and a fifth opening (not shown) passing through the fourth interlayer dielectric layer 129; removing the fourth patterning mask layer; filling the third opening, the fourth opening and the fifth opening with a conductive material respectively, thereby forming the third metal interconnecting structure 130, the fourth metal interconnecting structure 131 and the fifth metal interconnecting structure 132.

In some embodiment, the third opening and the fourth opening may be the same opening, and the third metal interconnecting structure 130 and the fourth metal interconnecting structure 131 may be connected with each other to form one metal interconnecting structure.

Embodiments of the present disclosure also provide an LDMOS device. Referring to FIG. 8, FIG. 8 schematically shows the structure of the LDMOS device according to one embodiment of the present disclosure.

In some embodiment, the LDMOS device may include the substrate 100, and the source region 102, the drain region 103 and the drift region 101 are disposed in the substrate 100. The drain region 103 is disposed in the drift region 101. The body region 104 and the well region contact end 105 may also be disposed in the substrate 100, and the source region 102 and the well region contact end 105 may be disposed in the body region 104. The shallow trench isolation 106 may also be formed in the substrate 100 for defining an active area.

In some embodiment, the LDMOS device may further include the gate structure 110 disposed on the surface of the substrate 100. The gate structure 110 is disposed between the source region 102 and the drain region 103, and the gap is formed between the gate structure 110 and the drain region 103.

In some embodiment, the gate structure 110 may include the gate layer 111, the gate dielectric layer 112 and the sidewall 113.

In some embodiment, the LDMOS device may further include the silicide block layer 115 for covering at least a portion of the surface of the substrate 100 between the gate structure 110 and the drain region 103.

In some embodiment, the silicide block layer 115 covers a portion of the top surface of the gate structure 110, the sidewall of the gate structure 110, and the surface of the substrate 100 between the sidewall of the gate structure 110 and the drain regions 103. The sidewall of the gate structure 110 is the sidewall of the gate structure 110 adjacent to the drain region 103. When the gate structure 110 includes the gate layer 111, the gate dielectric layer 112 and the sidewall 113, the silicide block layer 115 covers a top surface of the gate layer 111 and a surface of the sidewall 113 of the gate structure 110 adjacent to the drain region 103.

In some embodiment, the silicide block layer 115 is a metal silicide block layer. The silicide block layer 115 may be made of a material including an oxide such as silicon dioxide, or including a nitride or an oxynitride, such as silicon nitride and/or silicon oxynitride, or including a stacked structure formed of oxide, nitride, and oxynitride, wherein the oxide may be located in a lower layer, that is, near the surface of the substrate 100, and the nitride and the oxynitride may be located in an upper layer, that is, away from the surface of the substrate 100.

In some embodiment, the LDMOS device may further include the metal silicide layer 116 disposed on the surface of the source region 102, the surface of the drain region 103, the surface of the well region contact end 105 and a portion of the top surface of the gate structure 110, in order to reduce a contact resistance. The metal silicide layer 116 may be made of a material including one or more of CoSix, NiSix, and PtSix.

In some embodiment, the LDMOS device may further include the first conductive structure 119 and the second conductive structure 120, one end of the first conductive structure 119 is electrically connected with the source region 102, and one end of the second conductive structure 120 is electrically connected with the drain region 103.

In some embodiment, the LDMOS device may further include the first interlayer dielectric layer 118 for covering the surface of the substrate 100, the source region 102, the drain region 103, the gate structure 110 and the silicide block layer 115.

In some embodiment, the LDMOS device may further include the stop layer 117 for covering the surface of the substrate 100, the source region 102, the drain region 103, the gate structure 110, the metal silicide layer 116 and the silicide block layer 115, and the first interlayer dielectric layer 118 is disposed on the stop layer 117. The first conductive structure 119 and the second conductive structure 120 are disposed in the first interlayer dielectric layer 118, and the one end of the first conductive structure 119 and the end of the second conductive structure 120 respectively pass through the stop layer 117 and extend to the surface of the source region 102 and the surface of the drain region 103.

In some embodiment, the LDMOS device may further include the sixth conductive structure 121 disposed in the first interlayer dielectric layer 118, and one end of the sixth conductive structure 121 passes through the stop layer 117 and is electrically connected with the well region contact end 105.

In some embodiment, each of the first conductive structure 119, the second conductive structure 120 and the sixth conductive structure 121 may be made of a material including, but not limited to, a metal material including one or more of silver, gold, copper, titanium, palladium, platinum, tungsten and aluminum. The first conductive structure 119, the second conductive structure 120, and the sixth conductive structure 121 may be made of the same material or different materials.

In some embodiment, the LDMOS device may further include the first metal interconnecting structure 123 and the second metal interconnecting structure 124. The first metal interconnecting structure 123 is electrically connected with the other end of the first conductive structure 119, and the second metal interconnecting structure 124 is electrically connected with the other end of the second conductive structure 120. When the LDMOS device includes the sixth conductive structure 121, the first metal interconnecting structure 123 is also electrically connected with the other end of the sixth conductive structure 121.

In some embodiment, the LDMOS device may further include the second interlayer dielectric layer 122 for covering the surface of the first interlayer dielectric layer 118, the first conductive structure 119, the second conductive structure 120 and the sixth conductive structure 121. The first metal interconnecting structure 123 and the second metal interconnecting structure 124 are disposed in the second interlayer dielectric layer 122.

In some embodiment, the LDMOS device may further include the third conductive structure 126, and one end of the third conductive structure 126 is disposed on the surface of the silicide block layer 115. In this embodiment, the one end of the third conductive structure 126 is disposed on the surface of the stop layer 117.

In some embodiment, a plurality of third conductive structures 126 are formed with a spacing apart from each other.

In some embodiment, the plurality of third conductive structures 126 may be respectively disposed on the surface of the silicide block layer 115 on the top surface of the gate structure 110, and the surface of the silicide block layer 115 on the sidewall of the gate structure 110, and the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the top surface of the gate structure 110, the surface of the stop layer 117 on the sidewall of the gate structure 110, and the surface of the stop layer 117 on the substrate 100 between the sidewall of the gate structure 110 and the drain region 103.

In some embodiment, the plurality of third conductive structures 126 may be respectively disposed on the surface of the silicide block layer 115 on the sidewall 113 of the gate structure 110, and the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the sidewall 113 of the gate structure 110, and the surface of the stop layer 117 on the substrate 100 between the sidewall of the gate structure 110 and the drain region 103.

In some embodiment, the plurality of third conductive structures 126 may be respectively disposed on the surface of the silicide block layer 115 on the substrate 100 between the sidewall of the gate structure 110 and the drain region 103. The sidewall of the gate structure 110 is the sidewall of the gate structure 110 adjacent to the drain region 103. When the surface of the silicide block layer 115 is formed with the stop layer 117, the plurality of third conductive structures 126 may be respectively disposed on the surface of the stop layer 117 on the substrate 100 between the sidewall of the gate structure 110 and the drain region 103.

In some embodiment, the LDMOS device may further include the third interlayer dielectric layer 125. The third interlayer dielectric layer 125 covers the surface of the second interlayer dielectric layer 122, the first metal interconnecting structure 123 and the second metal interconnecting structure 124, and the third conductive structure 126 is disposed in the third interlayer dielectric layer 125, the second interlayer dielectric layer 122 and the first interlayer dielectric layer 118.

In some embodiment, the LDMOS device may further include the fourth conductive structure 127 and the fifth conductive structure 128 disposed in the third interlayer dielectric layer 125. One end of the fourth conductive structure 127 is electrically connected with the first metal interconnecting structure 123, and one end of the fifth conductive structure 128 is electrically connected with the second metal interconnecting structure 124.

In some embodiment, the third conductive structure 126, the fourth conductive structure 127 and the fifth conductive structure 128 may be made of a material including one or more of silver, gold, copper, titanium, palladium, platinum, tungsten, and aluminum. The third conductive structure 126, the fourth conductive structure 127 and the fifth conductive structure 128 may be made of the same material or different materials.

In some embodiment, the LDMOS device may further include the third metal interconnecting structure 130 electrically connected with the other end of the third conductive structure 126.

In some embodiment, the LDMOS device may further include the fourth interlayer dielectric layer 129. The fourth interlayer dielectric layer 129 covers the surface of the third interlayer dielectric layer 125, the third conductive structure 126, the fourth conductive structure 127 and the fifth conductive structure 128, and the third metal interconnecting structure 130 is disposed in the fourth interlayer dielectric layer 129.

In some embodiment, the LDMOS device may further include the fourth metal interconnecting structure 131 and the fifth metal interconnecting structure 132 disposed in the fourth interlayer dielectric layer 129. The fourth metal interconnecting structure 131 is electrically connected with the other end of the fourth conductive structure 127, and the fifth metal interconnecting structure 132 is electrically connected with the other end of the fifth conductive structure 128.

In some embodiment, the fourth metal interconnecting structure 131 may be electrically connected with the third metal interconnecting structure 130. In other embodiments, an isolation structure may be disposed between the fourth metal interconnecting structure 131 and the third metal interconnecting structure 130. For example, the fourth metal interconnecting structure 131 is electrically isolated from the third metal interconnecting structure 130 by the fourth interlayer dielectric layer 129. For the convenience of describing the fourth metal interconnecting structure 131 and the third metal interconnecting structure 130 respectively, the two metal interconnecting structures are separated by the broken line in FIG. 8, but it can be understood that when the four metal interconnecting structure 131 and the third metal interconnecting structure 130 are connected with each other to form one metal interconnecting structure, there is no boundary between the two metal interconnecting structures.

In some embodiment, an isolation structure, such as the fourth interlayer dielectric layer 129, may be disposed between the third metal interconnecting structure 131 and the fifth metal interconnecting structure 132.

In some embodiment, the fourth metal interconnecting structure 131 is electrically connected with the third metal interconnecting structure 130. The fourth metal interconnecting structure 131 is configured to be applied with a first voltage, and the fifth metal interconnecting structure 132 is configured to be applied with a second voltage that is higher than the first voltage. In this way, the third conductive structure 126 can introduce a low voltage near the drain region 103, which effectively transfers a high electric field originally pointing to the drain region 103 from the side edge of the gate structure 110, thereby increasing the breakdown voltage of the LDMOS device.

In some embodiment, the fourth metal interconnecting structure 131 and the third metal interconnecting structure 130 may be connected with each other to form one metal interconnecting structure.

In some embodiment, the first interlayer dielectric layer 118, the second interlayer dielectric layer 122 and the third interlayer dielectric layer 125 may be made of the same material, such as oxide including silicon dioxide. In other embodiments, the first interlayer dielectric layer 118, the second interlayer dielectric layer 122 and the third interlayer dielectric layer 125 may also be made of different materials.

In some embodiment, the first metal interconnecting structure 123, the second metal interconnecting structure 124, the third metal interconnecting structure 130, the fourth metal interconnecting structure 131 and the fifth interconnecting structure 132 may be made of a material including one or more of silver, gold, copper, titanium, palladium, platinum, tungsten, and aluminum. The first metal interconnecting structure 123, the second metal interconnecting structure 124, the third metal interconnecting structure 130, the fourth metal interconnecting structure 131 and the fifth metal interconnecting structure 132 may be made of the same material or different materials.

In the LDMOS device according to some embodiment of the present disclosure, the third metal interconnecting structure 130 and the third conductive structure 126 form a field plate. The field plate acts as an upper plate of a capacitor, the drift region 101 acts as a lower plate of the capacitor, and the silicide block layer 115 and the stop layer 117 act as a dielectric. The field plate increases the breakdown voltage that the LDMOS device can withstand by changing an electric field distribution. Further, since the silicide block layer 115 is formed on the surface of the substrate 100, the on-resistance of the LDMOS device is greatly reduced, as compared with the field plate of an STI formed between the source region and the drain region in the conventional technology.

Further, the first conductive structure 119 and the second conductive structure 120 are disposed in the first interlayer dielectric layer 118, and the third conductive structure 126 is disposed in the third interlayer dielectric layer 125, the second interlayer dielectric layer 122 and the first interlayer dielectric layer 118, which facilitates flexible control of the size of the third conductive structure 126; and the one end of the third conductive structure 126 extends to the surface of the stop layer 117, thus even when the third conductive structure 126 is very close to the side edge of the gate structure 110, the third conductive structure 126 can be prevented from contacting the substrate 100 to cause the breakdown voltage of the LDMOS device to reduce due to the thin thickness of the stop layer located at the side edge of the gate structure 110.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. An LDMOS (Lateral Diffused Metal Oxide Semiconductor) device, comprising:
   a substrate, wherein a source region, a drain region and a drift region are formed in the substrate, and the drain region is disposed in the drift region;
   a gate structure disposed on a surface of the substrate between the source region and the drain region, wherein a gap is formed between the gate structure and the drain region;
   a silicide block layer covering at least a portion of the surface of the substrate between the gate structure and the drain region;
   a first conductive structure and a second conductive structure, wherein one end of the first conductive structure is electrically connected with the source region, and one end of the second conductive structure is electrically connected with the drain region;
   a first metal interconnecting structure and a second metal interconnecting structure, wherein the first metal interconnecting structure is electrically connected with the other end of the first conductive structure, and the second metal interconnecting structure is electrically connected with the other end of the second conductive structure;
   a third conductive structure with one end disposed on a surface of the silicide block layer; and
   a third metal interconnecting structure electrically connected with the other end of the third conductive structure;
   a fourth conductive structure and a fifth conductive structure, wherein one end of the fourth conductive structure is electrically connected with the first metal interconnecting structure, and one end of the fifth conductive structure is electrically connected with the second metal interconnecting structure;
   a fourth metal interconnecting structure and a fifth metal interconnecting structure, wherein the fourth metal interconnecting structure is electrically connected with the other end of the fourth conductive structure, and the fifth metal interconnecting structure is electrically connected with the other end of the fifth conductive structure;
   wherein the fourth metal interconnecting structure is electrically connected with the third metal interconnecting structure, and there is not electrical connection relationship between the third metal interconnecting structure and the fifth metal interconnecting structure; and
   the fourth metal interconnecting structure is configured to be applied with a first voltage, the fifth metal interconnecting structure is configured to be applied with a second voltage, and the second voltage is higher than the first voltage.

2. The LDMOS device according to claim 1, further comprising:
   a stop layer covering the surface of the substrate, the source region, the drain region, the gate structure and the silicide block layer;
   wherein the one end of the first conductive structure and the one end of the second conductive structure respectively pass through the stop layer and extend to a surface of the source region and a surface of the drain region, and the one end of the third conductive structure extends to a surface of the stop layer.

3. The LDMOS device according to claim 2, wherein the stop layer is made of nitride or oxynitride.

4. The LDMOS device according to claim 1, wherein the silicide block layer covers a portion of a top surface of the gate structure, a sidewall of the gate structure, and a portion of the surface of the substrate between the sidewall of the gate structure and the drain region.

5. The LDMOS device according to claim 4, wherein a plurality of third conductive structures are disposed with a spacing from each other; and
   the plurality of third conductive structures are respectively disposed on the surface of the silicide block layer on the top surface of the gate structure, the surface of the silicide block layer on the sidewall of the gate structure, and the surface of the silicide block layer on the substrate between the sidewall of the gate structure and the drain region; or, the plurality of third conductive structures are respectively disposed on the surface of the silicide block layer on the sidewall of the gate structure and the surface of the silicide block layer on the substrate between the sidewall of the gate structure and the drain region; or, the plurality of third conductive structures are respectively disposed on the surface of the silicide block layer on the substrate between the sidewall of the gate structure and the drain region.

6. The LDMOS device according to claim 1, wherein the silicide block layer is made of oxide or nitride.

7. The LDMOS device according to claim 1, further comprising:
   a metal silicide layer, disposed on the source region, the drain region and at least a portion of a top surface of the gate structure.

8. The LDMOS device according to claim 1, further comprising:
   a first interlayer dielectric layer covering the surface of the substrate, the source region, the drain region, the gate structure and the silicide block layer;
   wherein the first conductive structure and the second conductive structure are disposed in the first interlayer dielectric layer.

9. The LDMOS device according to claim 8, further comprising:
   a second interlayer dielectric layer covering a surface of the first interlayer dielectric layer, the first conductive structure and the second conductive structure;
   wherein the first metal interconnecting structure and the second metal interconnecting structure are disposed in the second interlayer dielectric layer.

10. The LDMOS device according to claim 9, further comprising:
- a third interlayer dielectric layer covering a surface of the second interlayer dielectric layer, the first metal interconnecting structure and the second metal interconnecting structure;
- wherein the third conductive structure is disposed in the third interlayer dielectric layer, the second interlayer dielectric layer and the first interlayer dielectric layer.

11. The LDMOS device according to claim 10, further comprising:
- a fourth interlayer dielectric layer covering a surface of the third interlayer dielectric layer and the third conductive structure;
- wherein the third metal interconnecting structure is disposed in the fourth interlayer dielectric layer.

* * * * *